US007679186B2

(12) United States Patent
Jung et al.

(10) Patent No.: US 7,679,186 B2
(45) Date of Patent: Mar. 16, 2010

(54) PIEZOELECTRIC MICRO ELECTRO-MECHANICAL SYSTEM SWITCH, ARRAY OF THE SWITCHES, AND METHOD OF FABRICATING THE SAME

(75) Inventors: Sung Hae Jung, Daejeon (KR); Myung Lae Lee, Daejeon (KR); Sung Weon Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 478 days.

(21) Appl. No.: 11/634,627

(22) Filed: Dec. 6, 2006

(65) Prior Publication Data

US 2007/0132044 A1 Jun. 14, 2007

(30) Foreign Application Priority Data

Dec. 8, 2005 (KR) .................. 10-2005-0120188
May 23, 2006 (KR) .................. 10-2006-0046282

(51) Int. Cl.
*H01L 23/48* (2006.01)
(52) U.S. Cl. ............... 257/734; 257/618; 257/E21.009; 257/E21.643; 257/E29.324; 438/48; 438/50; 310/330; 310/328
(58) Field of Classification Search ............... 257/618, 257/734, E21.009, E21.643, E23.324; 438/48, 438/50; 310/328, 330
See application file for complete search history.

(56) References Cited

U.S. PATENT DOCUMENTS 7,109,641 B2 * 9/2006 Park ........................ 310/330

7,402,907 B2 * 7/2008 Ohguro ..................... 257/734
2004/0129953 A1 * 7/2004 Tamura et al. ............. 257/202
2006/0134825 A1 * 6/2006 DCamp et al. ............. 438/106

FOREIGN PATENT DOCUMENTS

KR 10-2004-0092228 11/2004
KR 1020040099808 12/2004

OTHER PUBLICATIONS

Beck, C.M., et al., "Microwave Filters and Switches Produced Using Micro-Machining Techniques." *Marconi Caswell Ltd.*, Caswell, Towcester, Northants NN12 83Q, UK.

* cited by examiner

*Primary Examiner*—Zandra Smith
*Assistant Examiner*—Telly D Green
(74) *Attorney, Agent, or Firm*—Ladas & Parry LLP

(57) ABSTRACT

A piezoelectric micro electro-mechanical system switch (MEMS), an array of piezoelectric MEMS switches, and a method of fabricating the switch, which are capable of improving low voltage and switching characteristics while securing high signal isolation, are provided. The piezoelectric MEMS switch includes a semiconductor substrate including a groove, a support formed over the semiconductor substrate and the groove. An actuator including a piezoelectric layer is formed on the support. A switching member is formed on the support on one side of the actuator, wherein upward movement of the switching member changes by a deformation of the piezoelectric layer of the actuator. Radio frequency (RF) transfer lines are arranged at a predetermined distance on the switching member and are separated by a predetermined interval from each other. The actuator is formed to have at least two cantilevers each having one end such that the ends are connected to each other.

11 Claims, 10 Drawing Sheets

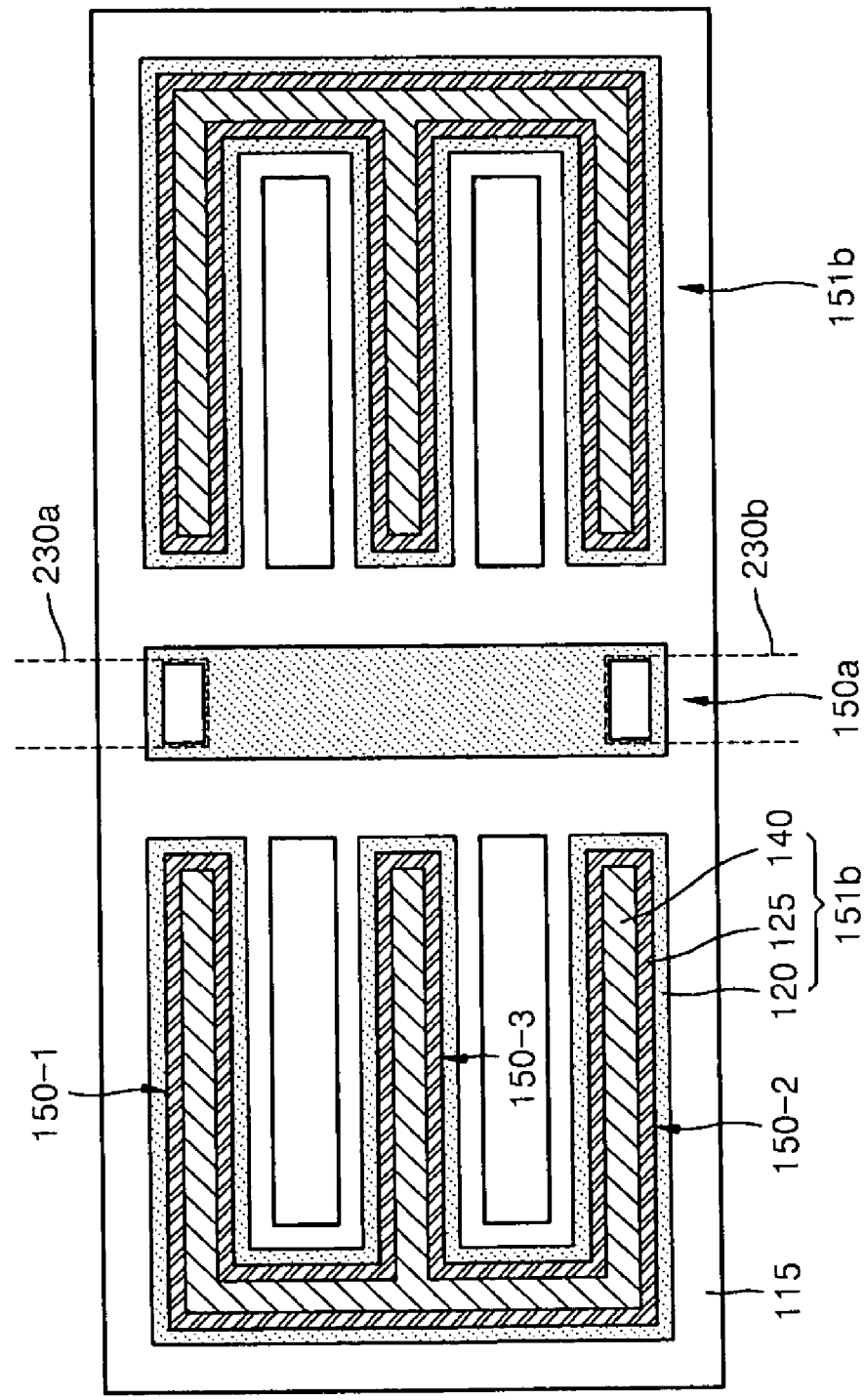

PIEZOLECTRIC MICRO ELECTRO-MECHANICAL SYSTEM SWITCH, ARRAY OF THE SWITCHES, AND METHOD OF FABRICATING THE SAME

CROSS-REFERENCE TO RELATED PATENT APPLICATION

This application claims the benefit of Korean Patent Application Nos. 10-2005-0120188, filed on Dec. 8, 2005 and 10-2006-0046282, filed on May 23 in the Korean Intellectual Property Office, the disclosures of which are incorporated herein in their entirety by reference.

BACKGROUND OF THE INVENTION

1. Field of the Invention

The present invention relates to a piezoelectric micro electro-mechanical system (MEMS) switch, an array of piezoelectric MEMS switches, and a method of fabricating the piezoelectric MEMS switch, and more particularly, to a piezoelectric MEMS switch having an actuator in a cantilever form, an array of the switches, and a method of fabricating the piezoelectric MEMS switch.

2. Description of the Related Art

With the rapid development of information communication, small, light and high-performance information communication systems are highly in demand. Accordingly, the development of parts for the systems is urgent. In particular, one of such parts of the information communication system is a radio frequency (RF) switch that is used to control signals in the information communication system. Semiconductor switches, such as field effect transistors (FETs) or PIN diodes, have been widely used as RF switches. However, the semiconductor switches have problems of high power loss, signal distortion, non-linearity, high insertion loss, and low isolation.

In order to solve the problems associated with the semiconductor switches, much attention to a radio frequency micro electro mechanical system (RF MEMS) switch using a micro machining technique has recently been given.

An RF MEMS switch short-circuits or opens the RF transfer lines by a mechanical operation. This RF switch has less resistance loss than a semiconductor switch, uses low power, less signal distortion and high isolation. Thus, the RF MEMS switch can be applied to several fields such as digital controlled antennas, artificial satellite systems, mobile communication transmission and reception systems, and the like.

Such an RF MEMS switch may be actuated using an electrostatic-force actuating method, a magnetic-force actuating method, a thermal-deformation actuating method, and a pressure-based actuating method. The electrostatic-force actuating method has an advantage of low-power actuation, but the electrostatic-force actuating method has difficulties in actuating the switch at a low voltage of 3V or less, and thus a separate DC-DC converter is required. The use of the separate DC-DC converter causes power loss. The magnetic-force actuating method and thermal-deformation actuating method have a higher power loss than the electrostatic-force actuating method. Particularly, the thermal-deformation actuating method has a disadvantage of low response speed. Currently, a piezoelectric RF MEMS switch having less power consumption and higher response speed at a low driving voltage than the electrostatic-force, magnetic-force, and thermal-deformation methods is widely used.

Referring to FIG. 1, a conventional piezoelectric RF MEMS switch includes electrically separate RF transfer lines 10a and 10b, and a switching member 20 located under the RF transfer lines 10a and 10b for performing switching operations due to a piezoelectric phenomenon. An RF signal is applied to the RF transfer lines 10a and 10b. The long distance between the RF transfer lines 10a and 10b leads to excellent isolation, i.e., switching characteristics. The switching member 20 moves up similar to how an actuator having a piezoelectric layer (not shown) operates to electrically connect the separate RF transfer lines 10a and 10b.

However, if the RF transfer lines 10a and 10b are spaced apart by a sufficient interval to obtain excellent isolation characteristics, i.e., switching characteristics of the MEMS switch, there is a drawback in that the shape of the switching member 20 deforms, i.e., when switching member moves up. That is, the switching member 20 needs to have a length as long as the distance between the RF transfer lines 10a and 10b and an actuator (not shown) having a piezoelectric layer for controlling the switching member 20 also needs to have a line width as long as the length of the switching member 20 in order to electrically connect RF transfer lines 10a and 10b which are sufficiently distanced apart. However, the increase in the line width of the actuator reduces a difference between the line width and the length of the actuator, and thus makes it difficult for the actuator to be strained longitudinally and a very high voltage is required by the actuator to move the switching member 20 to a desired height.

Furthermore, in order to lower an operation voltage in the conventional piezoelectric RF MEMS switch, a back surface of the semiconductor substrate on which the actuator is formed is etched so that the semiconductor substrate is penetrated. This increases processing time and costs. In addition, heavy stress is applied to the semiconductor substrate on which the actuator is formed.

After the piezoelectric RF MEMS switch is fabricated, the piezoelectric RF MEMS switch must be packaged in order to protect a moving structure therein. However, such a packaging process requires several processes including a wire bonding process and a molding process, furthermore complicating an entire process of fabricating the piezoelectric RF MEMS switch.

SUMMARY OF THE INVENTION

The present invention provides a piezoelectric micro electro-mechanical system (MEMS) switch and an array of the piezoelectric MEMS switches capable of improving low voltage actuation and switching characteristics while securing high signal isolation.

The present invention also provides a method of fabricating a piezoelectric MEMS switch capable of enhancing an operation voltage characteristic and protecting the piezoelectric MEMS switch from penetration etching and packaging a wafer.

According to an aspect of the present invention, there is provided a piezoelectric micro electro-mechanical system switch (MEMS) switch, including a semiconductor substrate including a groove; a support formed over the semiconductor substrate and the groove; an actuator formed on the support and including a piezoelectric layer; a switching member formed on the support on one side of the actuator, upward movement of the switching member being changed by deformation of the piezoelectric layer of the actuator; radio frequency (RF) transfer lines arranged at a predetermined distance on the switching member and separated by a predetermined interval from each other, wherein: the actuator is formed to have at least two cantilevers each having one end, the ends being connected to each other.

The switch may further include a cap wafer having first and second surfaces and attached to the semiconductor substrate at a predetermined interval, wherein the RF transfer lines may be formed on the first surface of the cap wafer that is opposite to the semiconductor substrate. The cap wafer may include an electrode pad formed on the second surface; and a via plug formed to pass through the cap wafer for electrically connecting the electrode pad and the RF transfer lines.

According to another aspect of the present invention, there is provided a piezoelectric MEMS switch including a semiconductor substrate including a groove; a support formed over the semiconductor substrate and the groove; a switching member arranged on a predetermined portion of the support; first and second actuators including a piezoelectric layer and symmetrically arranged on left and right sides of the switching member; a cap wafer that is opposite to the semiconductor substrate at a predetermined distance; and RF transfer lines separated from each other by a predetermined interval on a surface of the cap wafer corresponding to the switching member, wherein: the first and second actuators include at least two cantilevers having one end, the ends being connected with each other.

According to yet another aspect of the present invention, there is provided a method of fabricating a piezoelectric MEMS switch including forming a groove on a semiconductor substrate; burying the groove with a sacrifice layer; forming a support on a predetermined portion of the semiconductor substrate and the sacrifice layer; forming a lower electrode having at least two cantilevers and a contact connection portion spaced apart at a predetermined distance from the lower electrode on the support; forming a piezoelectric layer on the lower electrode; forming an upper electrode on the piezoelectric layer; forming contact portions on the upper electrode and the contact connection portion to obtain an actuator including the lower electrode, the piezoelectric layer, the upper electrode, and the contact portion and to obtain a switching member including the contact connection portion and the contact portion; removing the sacrifice layer; providing a cap wafer having one surface on which RF transfer lines spaced apart by a predetermined interval are formed and the other surface on which an electrode pad electrically connected to the RF transfer lines is formed; bonding the cap wafer to the semiconductor substrate so that the RF transfer lines of the cap wafer correspond to the switching member; and attaching a solder ball to the electrode pad.

According to another aspect of the present invention, there is provided an array of piezoelectric MEMS switches including a group of a number of piezoelectric MEMS switches arranged in a matrix; first contact pads electrically connected to the piezoelectric MEMS switches, respectively, for delivering a driving voltage to the piezoelectric MEMS switches; and a second contact pad connected to the number of piezoelectric MEMS switches for providing a ground voltage to the piezoelectric MEMS switches, wherein each piezoelectric MEMS switch includes an actuator having at least two cantilevers.

BRIEF DESCRIPTION OF THE DRAWINGS

The above and other features and advantages of the present invention will become more apparent by describing in detail embodiments thereof with reference to the attached drawings in which:

FIG. 2A illustrates an example of a switching member of the piezoelectric MEMS switch formed in a resistor form, and FIG. 2B illustrates an example of the switching member of the piezoelectric MEMS switch formed in a Metal-Insulator-Metal (MIM) capacitor form.

FIG. 3A illustrates an example of a switching member of the piezoelectric MEMS switch formed in a resistor form, and FIG. 3B illustrates an example of the switching member of the piezoelectric MEMS switch formed in an MIM capacitor form;

FIG. 4A illustrates an example of a switching member of the piezoelectric MEMS switch formed in a resistor form.

FIGS. 5A and 5B are plan views illustrating a piezoelectric MEMS switch in which an actuator including three cantilevers is arranged in a bridge form according to another embodiment of the present invention. Particularly, FIG. 5A illustrates an example of a switching member of the piezoelectric MEMS switch formed in a resistor form.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification.

Figure 1:
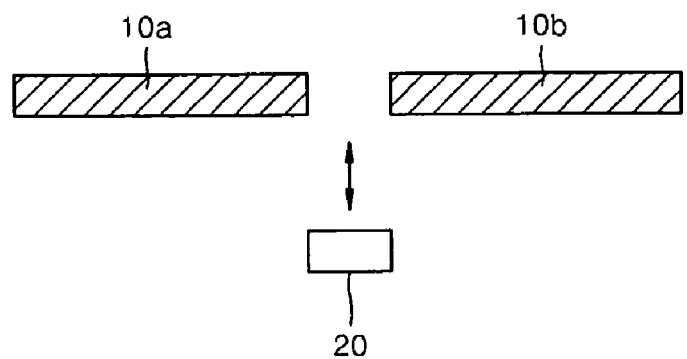
FIG. 1 is a schematic view illustrating an operation of a conventional piezoelectric MEMS switch.
Figure 2A:
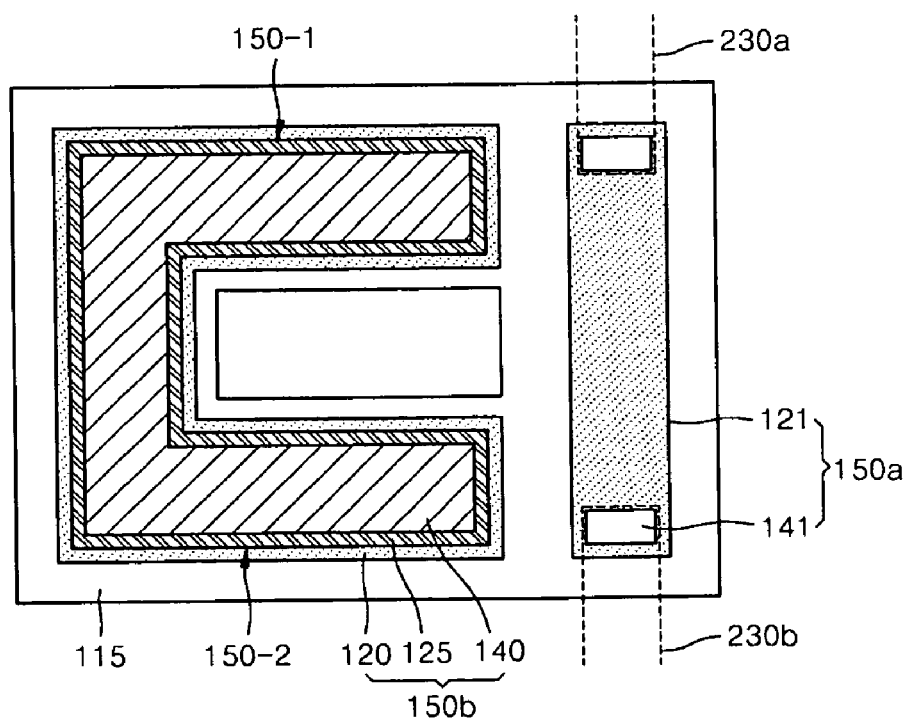
FIGS. 2A and 2B are plan views illustrating a piezoelectric MEMS switch having an actuator comprising two cantilevers according to an embodiment of the present invention. Particularly.

FIG. 2A is a plan view illustrating a piezoelectric MEMS switch according to an embodiment of the present invention.

Referring to FIG. 2A, a support 115 is formed on a semiconductor substrate (not shown). The support 115 may be formed of an insulating layer, e.g., a silicon nitride layer. The support 115 defines an area in which one switch will be formed. Although not shown in FIG. 2A, the semiconductor substrate includes a groove having a predetermined depth, and the support 115 is formed over the semiconductor substrate and the groove. The support 115 includes a switching member 150a for electrically connecting the RF transfer lines 230a and 230b that are spaced apart by a predetermined interval, and an actuator 150b for actuating the switching member 150a.

The switching member 150a may be formed in a resistor form having a contact connection portion 121 and a contact portion 141. The contact connection portion 121 and the contact portion 141 are both formed of a conductive layer. For example, the contact connection portion 121 may be formed of a metal layer such as Pt, and the contact portion 141 may be formed of an Au layer having very low resistivity. As the actuator 150b operates, the contact connection portion 121 moves up and the contact portion 141 on the contact connection portion 121 is brought in contact with the RF transfer lines 230a and 230b, such that the spaced apart RF transfer lines 230a and 230b are electrically connected with each other. In this case, the RF transfer lines may be spaced apart as wide as possible within an allowable range of integration in order to obtain an excellent signal isolation characteristic, and the contact connection portion 121 may be formed by a spacing distance between the RF transfer lines 230a and 230b or more. In this embodiment, the RF transfer lines 230a and 230b are spaced apart by a 50 to 150 µm interval, and the contact connection portion 121 may be formed in a length of about 50 to 200 µm.

Figure 2B:
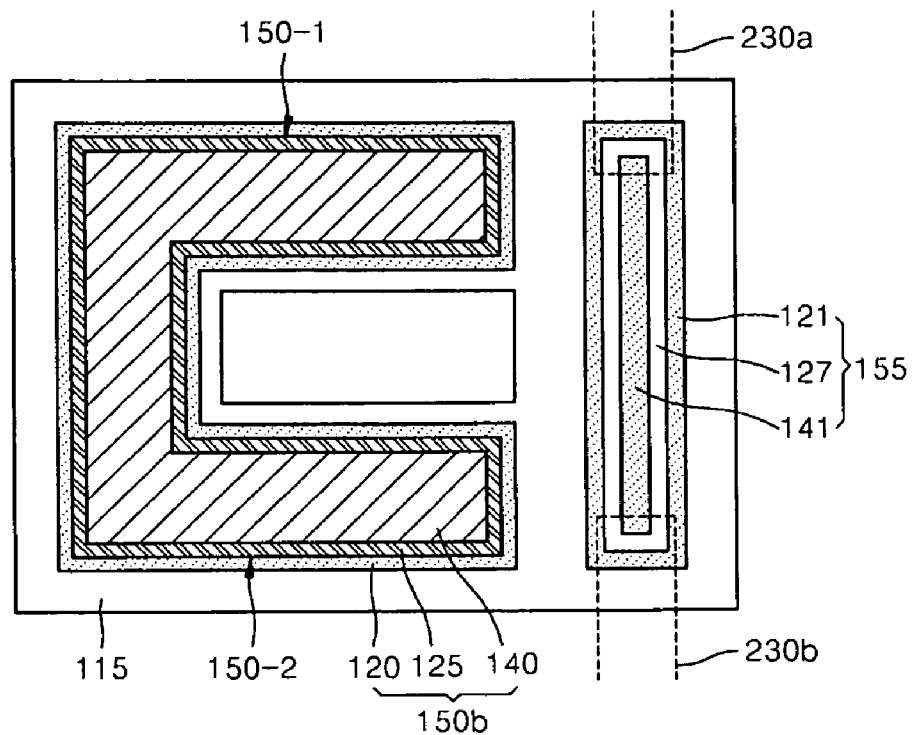

As shown in FIG. 2B, the switching member 150a, illustrated in FIG. 2A, may be formed in the form of an MIM capacitor 155 having an insulating layer 127 between the contact connection portion 121 and the contact portion 141. As a piezoelectric layer 125 in the actuator 150b deforms, the capacitance of the MIM capacitor 155 changes, such that the MIM capacitor 155 is brought in contact with the RF transfer lines 230a and 230b.

The actuator 150b includes at least two cantilevers 150-1 and 150-2. The cantilevers 150-1 and 150-2 have one end such that the ends of the cantilevers 150-1 and 150-2 are connected to each other, extend in parallel to each other, and are spaced apart by the length of the contact connection portion 121. The actuator 150b, which includes the cantilevers 150-1 and 150-2, includes a lower electrode 120, the piezoelectric layer 125, an upper electrode (not shown), and a contact portion 140. The lower electrode 120 and the upper electrode (not shown) may be formed of a Pt or pt/Ti material, the piezoelectric layer 125 may be formed of a lead zirconate titanate (PZT) or PLZT (PZT doped with La), and the contact portion 140 may be formed of an Au layer having very low resistivity. In the present embodiment, the lower electrode 120 may be formed simultaneously with the contact connection portion 121, and the contact portion 140 may be formed simultaneously with the contact portion 141 of the switching member 150a.

Figure 3A:
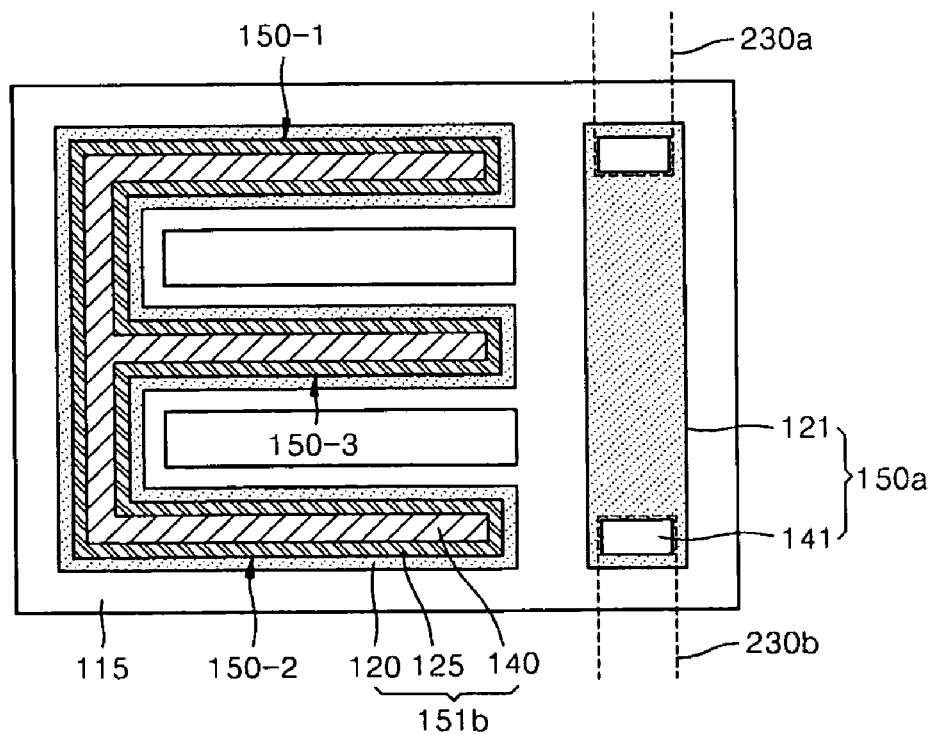
FIGS. 3A and 3B are plan views illustrating a piezoelectric MEMS switch having an actuator including three cantilevers according to another embodiment of the present invention. Particularly.
Figure 3B:
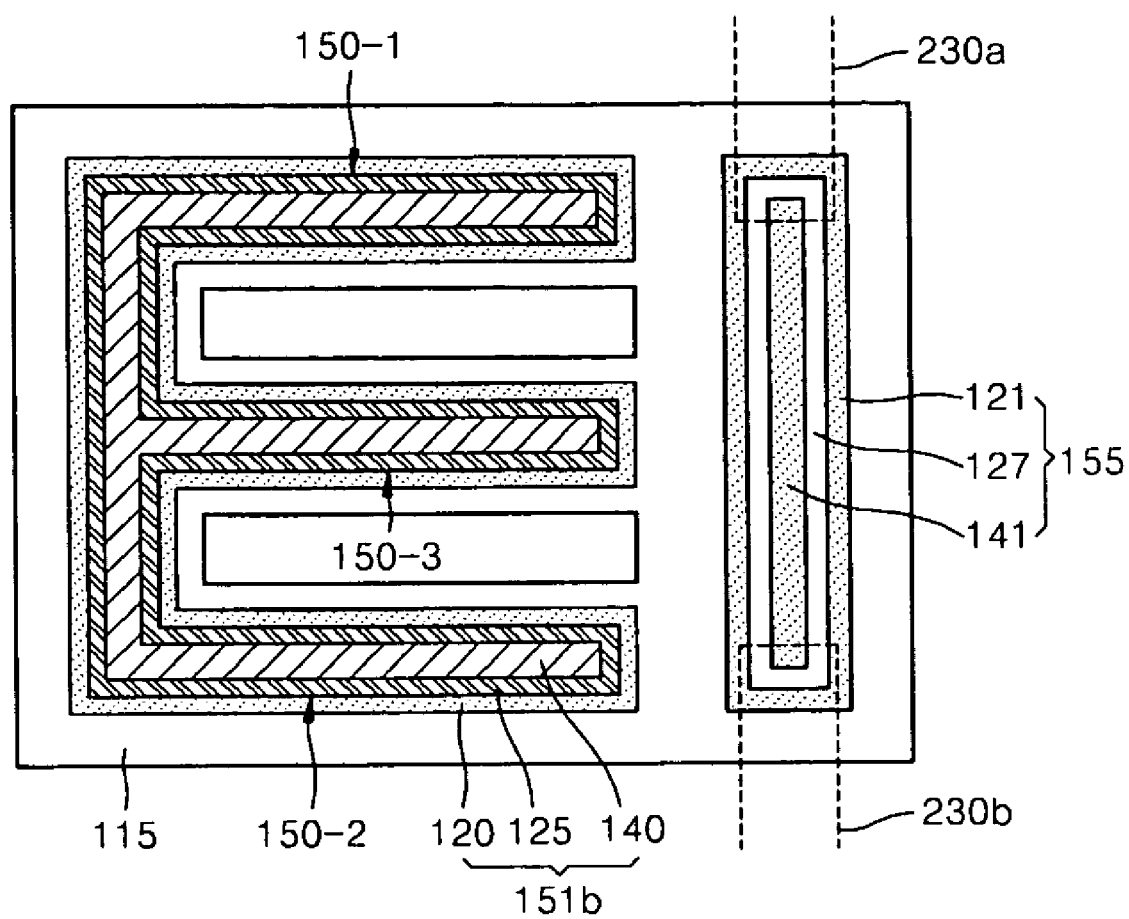

FIGS. 3A and 3B are plan views illustrating a piezoelectric MEMS switch having an actuator including three cantilevers according to another embodiment of the present invention.

As shown in FIGS. 3A and 3B, an actuator 151b may include three cantilevers 150-1, 150-2, and 150-3. In this case, the two outer cantilevers 150-1 and 150-2 may be spaced apart from each other by the length of a contact connection portion 121. In the present embodiment, the number of cantilevers is not limited to two or three, but the actuator may include a plurality of cantilevers within a range that allows integration. In the present embodiment, FIG. 3A illustrates an example of a switching member 150a in a resistor form, and FIG. 3B shows a switching member 155 in a capacitor form.

The operation of the piezoelectric MEMS switch of this embodiment will be described.

When a driving voltage and a ground voltage are respectively applied to a lower electrode 120 and an upper electrode (not shown), a piezoelectric layer 125, which is between the lower electrode 120 and the upper electrode, expands. This expansion moves the switching member 150a or 155 up, such that the switching member 150a or 155 is brought in contact with RF transfer lines 230a and 230b. In this case, as at least both cantilevers 150-1 and 150-2, i.e., the plurality of cantilevers, are used, the cantilevers 150-1 and 150-2 become thin and long. This assists in longitudinally deforming the piezoelectric layer 125, which can easily move the switching member 150a or 155 up. Hence, a high voltage is not needed in bringing the switching member 150a or 155 in contact with the RF transfer lines 230a and 230b. In addition, a sufficient interval between the RF transfer lines 230a and 230b can be secured without increasing the line widths of the cantilevers 150-1 and 150-2, thus enhancing a signal isolation characteristic.

Figure 4A:
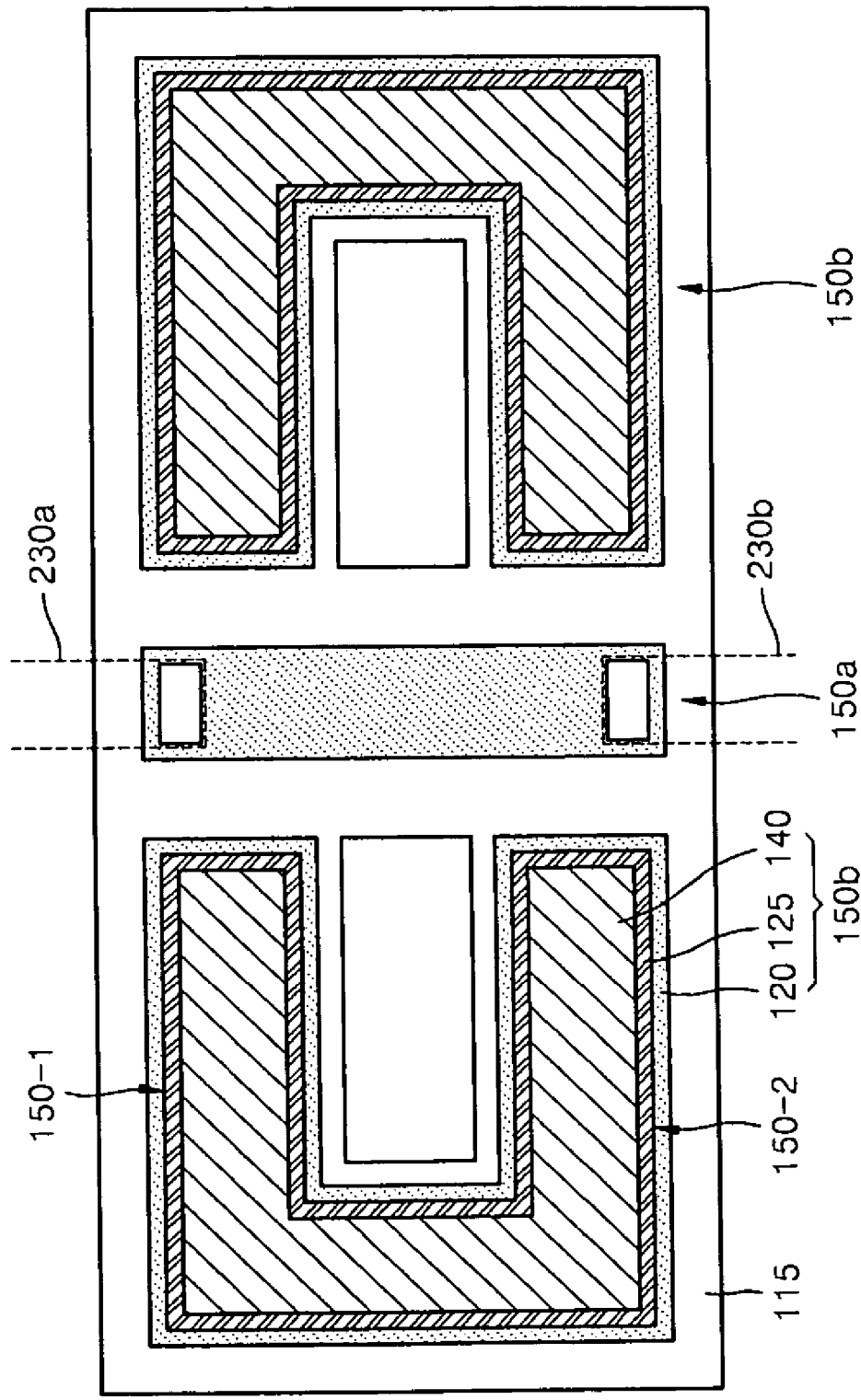
FIGS. 4A and 4B are plan views illustrating a piezoelectric MEMS switch in which an actuator having two cantilevers is arranged in a bridge form according to another embodiment of the present invention. Particularly.
Figure 4B:
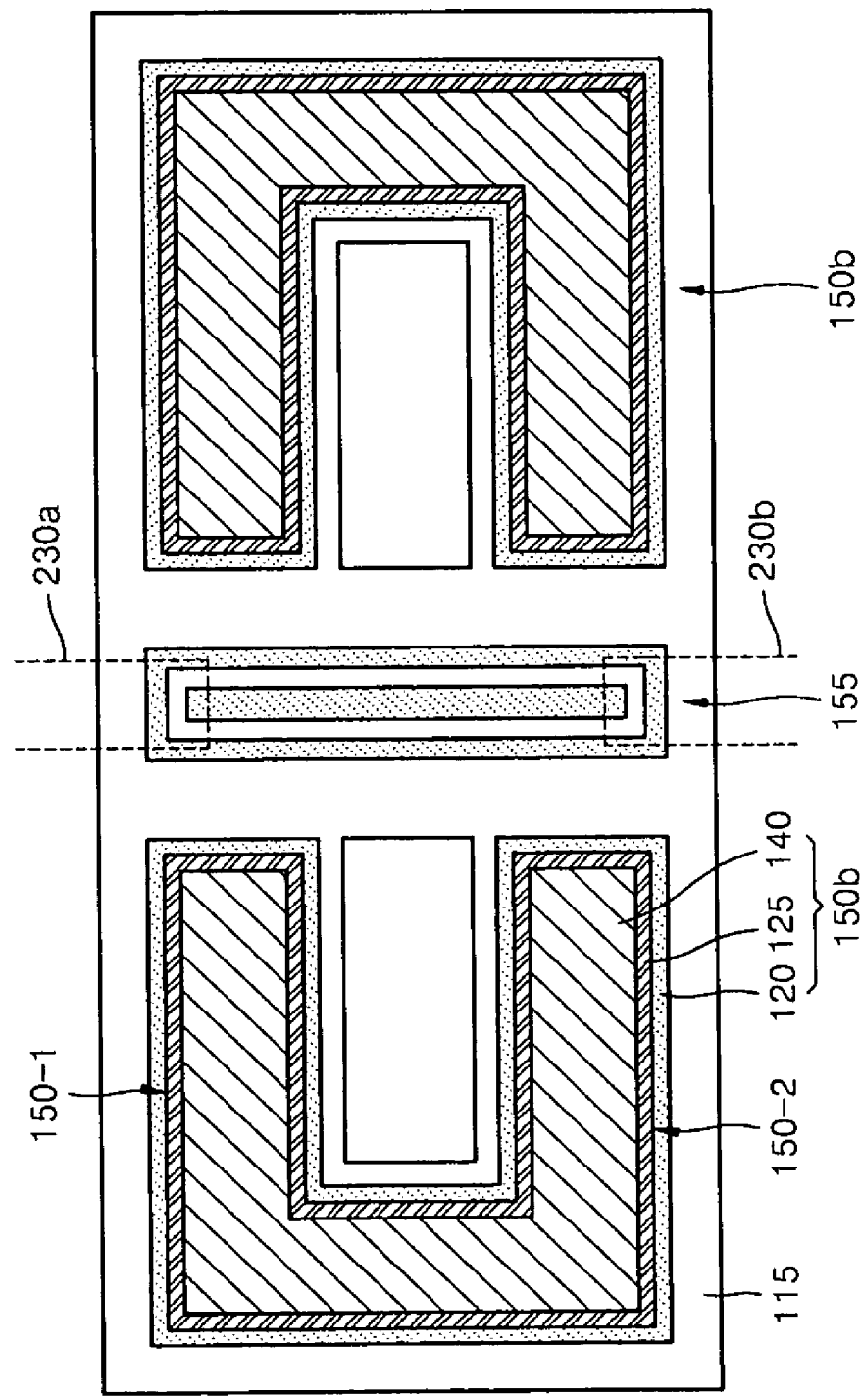

FIGS. 4A and 4B are plan views illustrating a piezoelectric MEMS switch in which an actuator having two cantilevers is arranged in a bridge form according to another embodiment of the present invention.

Figure 5B:
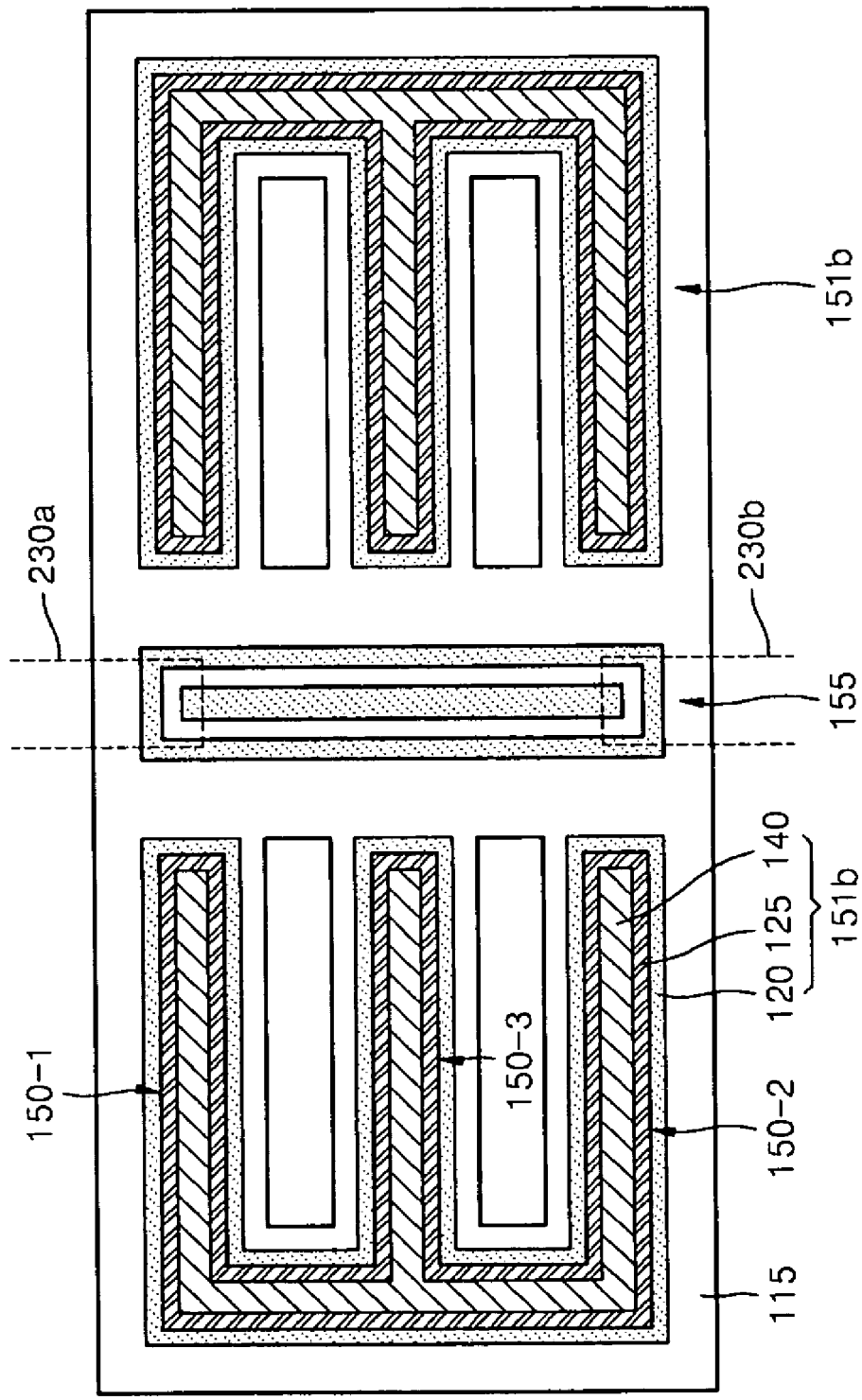
FIG. 5B illustrates an example of the switching member of the piezoelectric MEMS switch formed in an MIM capacitor form.

Referring to FIGS. 4A and 4B, the bridge type piezoelectric MEMS switch includes a pair of actuators 150b arranged on both sides of the switching member 150a. Accordingly, the pair of actuators 150b arranged on both sides of the switching member 150a control the switching member 150a, thereby increasing a switching speed. In addition, the switching member 150a can be actuated at a low voltage. In such a bridge type piezoelectric MEMS switch, the actuator 150b may be formed in a MIM capacitor structure as illustrated in FIG. 4B. The bridge type piezoelectric MEMS switch may be configured to have three cantilevers 150-1, 150-2, and 150-3, as illustrated in FIGS. 5A and 5B.

FIGS. 6A through 6D are cross-sectional views illustrating a method of fabricating a piezoelectric MEMS switch according to an embodiment of the present invention, in which an actuator is formed in a resistor form. FIGS. 6A through 6D are conceptual sectional views illustrating all primary parts of the piezoelectric MEMS switch, not substantial sectional views, for the convenience of illustrating.

Figure 6A:
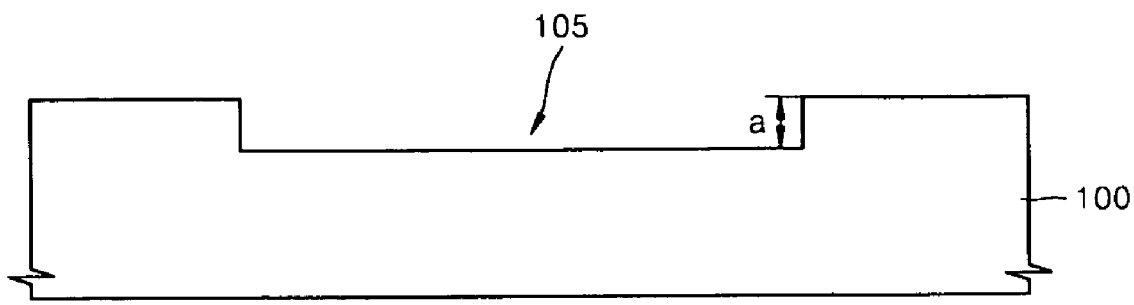
FIGS. 6A through 6D are cross-sectional views illustrating a method of fabricating a piezoelectric MEMS switch including an actuator having at least two cantilevers according to an embodiment of the present invention.

Referring to FIG. 6A, a photoresist pattern (not shown) is formed on a predetermined portion of a semiconductor substrate 100 and then, the semiconductor substrate 100 is etched to a predetermined depth a to form a groove 105. In the present embodiment, wet etching using Potassium Hydroxide (KOH) solution or anisotropic dry etching may be used. In the present embodiment, the groove 105 is provided to lower a driving voltage of the piezoelectric MEMS switch.

Figure 6B:
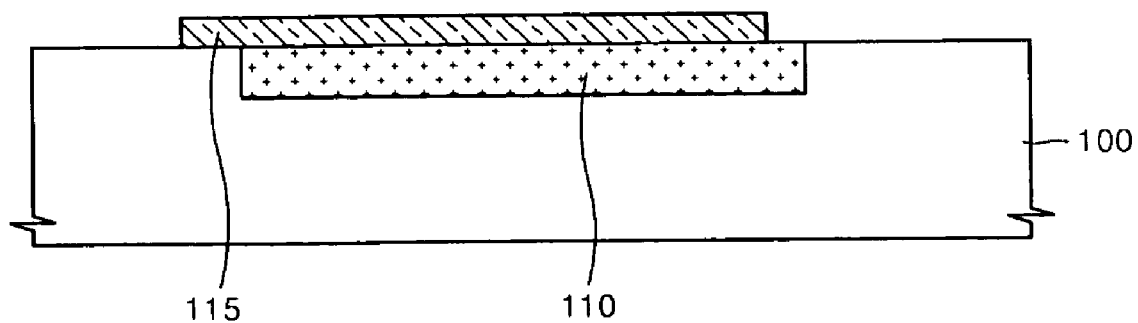

Referring to FIG. 6B, a sacrifice layer 110 is deposited on the semiconductor substrate 100 to fill the groove 105, and the sacrifice layer 110 is then planarized to correspond with the surface of the semiconductor substrate 100. For example, the sacrifice layer 110 may be a poly-silicon layer, and a chemical mechanical polishing method may be used for the planarization of the sacrifice layer 110. A support 115 is then formed on the semiconductor substrate 100 and the sacrifice layer 110. The support 115 may be formed of, for example, a silicon nitride layer $Si_3N_4$ over the semiconductor substrate 100 and the sacrifice layer 110.

Figure 6C:
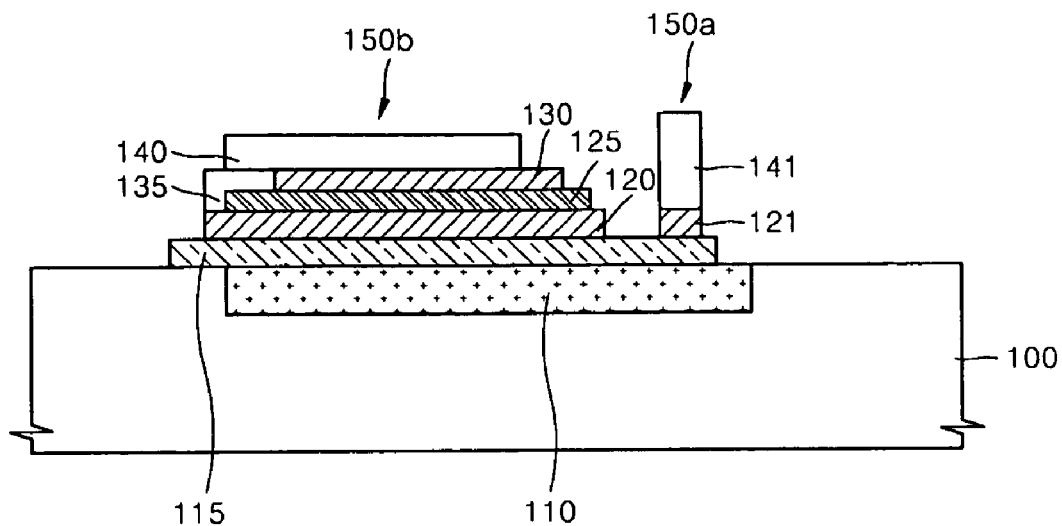

Referring to FIG. 6C, a conductive layer is deposited on the support 115 and then a predetermined portion of the conductive layer is patterned to form a lower electrode 120 of an actuator 150b and a contact connection portion 121 of a switching member 150a. In this case, the conductive layer may be a stacked layer of a rare metal layer such as Pt or Pr/Ti and a fire-resistant layer. A piezoelectric layer 125 is formed on the lower electrode 120 and then, an upper electrode 130 is formed on the piezoelectric layer 125 to obtain the actuator 150b. The piezoelectric layer 125 may be formed of a lead zirconate titanate (PZT) or PLZT (PZT doped with La) using a sol-gel coating method, and the upper electrode 130 may be formed of a rare metal layer such as Pt or $RuO_2$. Then, an air bridge 135 is formed between the upper electrode 130 and the lower electrode 120 using a known method, and contact portions 140 and 141 are selectively formed on the upper electrode 130 and the contact connection portion 121, respectively. The contact portions 140 and 141 may be, for example, Au, Pt or Cu having an excellent conductive characteristic.

Figure 6D:
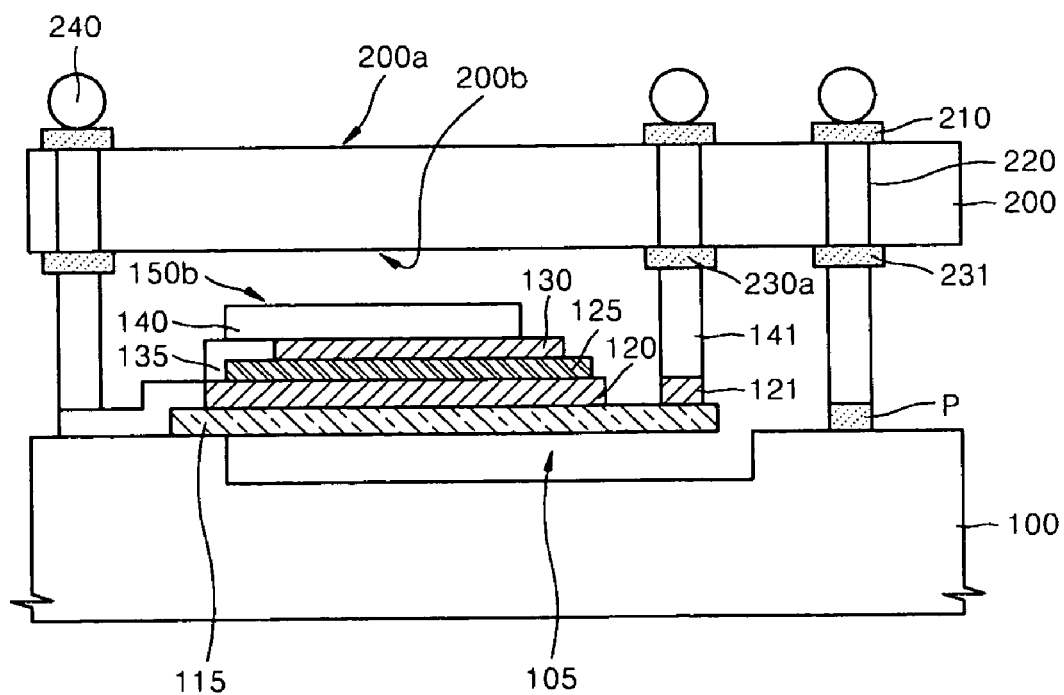

As illustrated in FIG. 6D, the sacrifice layer 110 is removed using a known method. Accordingly, the support 115 has one end formed on the semiconductor substrate 100 and the other end located over the groove 105 from which the sacrifice layer 110 has been removed, such that the support 115 has a cantilever shape. As the support 115, on which the actuator 150b is formed, is located over the groove 105, a driving voltage of the piezoelectric MEMS switch can be lowered. A contact pad p is then formed in a predetermined portion of the semiconductor substrate 100 using a known method. The contact pad p is connected to the lower electrode 120 or upper electrode 130 of the actuator 150b in order to deliver a driving voltage to the actuator 150b. In this case, a metal line 160 may be formed while the lower electrode 120 or the upper electrode 130 is formed and before the sacrifice layer 110 is removed.

Meanwhile, a cap wafer 200 is provided and is attached to the semiconductor substrate 100. The cap wafer 200 includes a first surface 200a, and a second surface 200b opposite to the first surface 200a. An electrode pad 210 is formed on a predetermined portion of the first surface 200a of the cap wafer 200. The electrode pad 210 may be formed using a Cu plating method. A via hole (not shown) is formed by etching the cap wafer 200 so that the electrode pad 210 is exposed, and then a via plug 220 is formed by burying a conductive layer in the via hole. The via plug 220 may be obtained by filling the via hole with Cu or Au using a plating method. Alternatively, the via plug 220 may be formed by filling the via hole with a ball solder cream of CuAg, CuAgSn, or CuAgSnNiGe and then, reflowing the ball solder cream. RF transfer lines 230a and 230b and an upper metal line 231 are then formed on the second surface 200b of the cap wafer 200 to be brought in contact with the via plug 220. The RF transfer lines 230a and 230b are lines for transferring an RF signal, and the upper metal line 231 is a signal transfer line for delivering a voltage to each electrode of the actuator 150b. In the present embodiment, the process of forming the electrode pad 210 and the process of forming the RF transfer lines 230a and 230b or the upper metal line 231 may be performed in a reverse order. The cap wafer 200 is then attached to the semiconductor substrate 100. The cap wafer 200 can be attached so that the RF transfer lines 230a and 230b of the cap wafer 200 correspond to the contact connection portion 121 of the semiconductor substrate 100. By attaching the cap wafer 200 to the semiconductor substrate 100, a wafer level package is completed while protecting the actuator 150a without a separate wire bonding process and a molding process. Solder balls 240 are then attached on the electrode pads 210.

In the piezoelectric MEMS switch according to an embodiment of the present invention, the actuator 150b and the switching member 150a can be protected from the exterior by only attaching the cap wafer 200 to the semiconductor substrate 100 without performing separate package processes (wire bonding and molding processes). This simplifies a package fabricating process and shortens a package fabricating time.

In addition, the actuator 150b and the RF transfer lines 230a and 230b are separately formed on different substrates (wafers), thereby simplifying a fabricating process. The RF transfer lines 230a and 230b are separated from the actuator 150b, thereby preventing mixing of signals.

For low-voltage actuation, the groove 105 is formed by etching the predetermined portion of the semiconductor substrate 100 to a predetermined depth, instead of etching the back surface of the semiconductor substrate 100 so that the semiconductor substrate 100 is penetrated, thereby shortening a substrate etching time and reducing stress on the substrate.

While the piezoelectric MEMS switch having the actuator 150b in a resistor form has been described by way of example in FIGS. 6A through 6D, an actuator 150b in an MIM capacitor form can be formed a similar way. That is, the actuator 150b may be formed in an MIM capacitor form only by adding a process of forming an insulating layer 127 (not shown) between the contact connection portion 121 and the contact portion 141.

Figure 7:
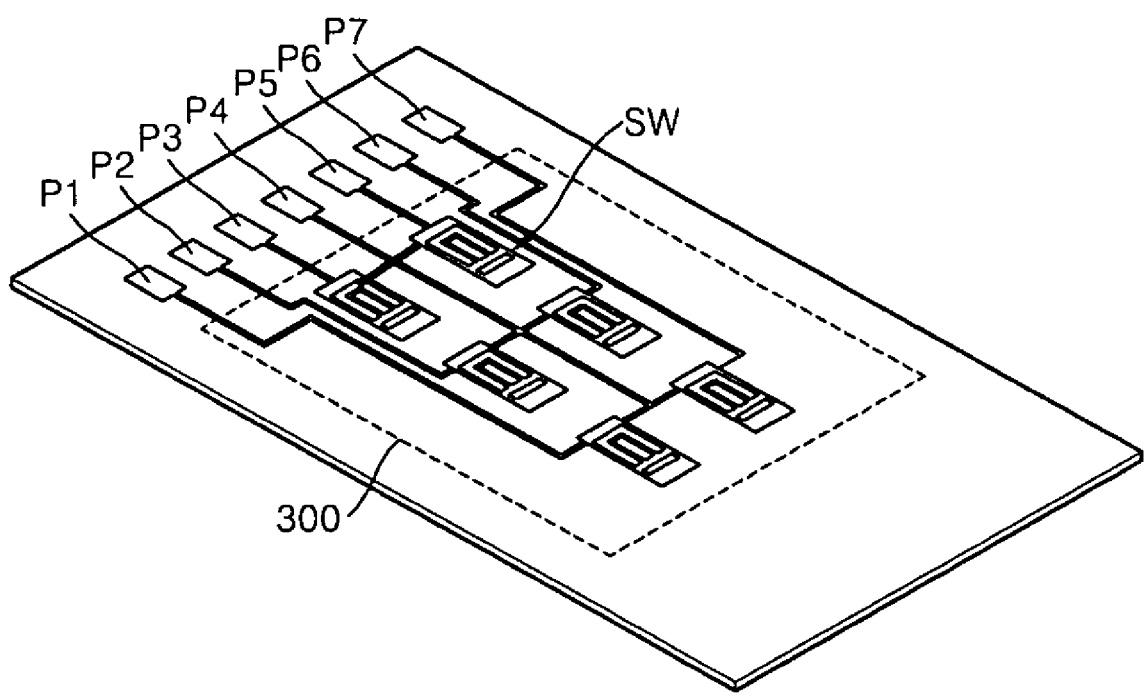
FIG. 7 is a plan view illustrating an array of a number of piezoelectric MEMS switches according to another embodiment of the present invention.

FIG. 7 is a plan view illustrating an array of a number of piezoelectric MEMS switches according to another embodiment of the present invention.

A piezoelectric MEMS switch array 300 includes six units of piezoelectric MEMS switches sw arranged in a 2×3 matrix form, as shown in FIG. 7. The piezoelectric MEMS switch sw unit includes an actuator having at least two cantilevers. The units of piezoelectric MEMS switches sw are arranged at predetermined intervals.

Seven contact pads p1 to p7 are arranged in parallel on one side of the 2×3 piezoelectric MEMS switch array 300. The central electrode pad p4 is a ground pad connected to upper electrodes (or lower electrodes) of the six remaining units of piezoelectric MEMS switches sw in order to apply a ground voltage to the upper electrodes (or lower electrodes). The other electrode pads p1, p2, p3, p5, p6 and p7 are each connected to the lower electrodes (or upper electrodes) of the units of piezoelectric MEMS switches in order to apply a driving voltage to the units of piezoelectric MEMS switches. Although the 2×3 piezoelectric MEMS switch array has been described in this embodiment, the present invention is not limited to the 2×3 piezoelectric MEMS switch array and the array may include a plurality of switches.

The piezoelectric MEMS switch array may be applied, as a switch device, to a portable telephone terminal to and from which a number of signals are input or output.

As described above, in the piezoelectric MEMS switch according to the present invention, the actuator includes at least two cantilevers. As the contact connection portion is controlled by the at least two cantilevers as described above, the RF transfer lines can be spaced apart by a sufficient interval, thereby enhancing signal isolation. The use of two or more cantilevers can enhance upward movement of the switching member.

A piezoelectric MEMS switch is configured in a bridge form in which actuators are arranged on left and right sides of a switching member (contact connection portion), such that both actuators control the contact connection portion in order to enhance a switching characteristic.

In addition, a number of piezoelectric MEMS switches arranged in an array can be applied to thermals transmitting a number of signals.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A piezoelectric micro electro-mechanical system (MEMS) switch, comprising:
   a semiconductor substrate including a groove;

a support formed over the semiconductor substrate and the groove;

an actuator formed on the support and including a piezoelectric layer;

a switching member formed on the support on one side of the actuator, wherein upward movement of the switching member changes by a deformation of the piezoelectric layer of the actuator;

a cap wafer having first and second surfaces and attached to the semiconductor substrate at a predetermined interval;

radio frequency (RF) transfer lines formed on the first surface of the cap water opposite to the semiconductor substrate so as to be over the switching member and separated by a predetermined interval from each other such that the upward movement of the switching member connects the RF transfer lines on the first surface, wherein the actuator is formed to have at least two cantilevers each having one end such that the ends are connected to each other.

2. The piezoelectric MEMS switch of claim 1, wherein the support is an insulating layer.

3. The piezoelectric MEMS switch of claim 1, wherein the actuator comprises:
a lower electrode formed on the support;
a piezoelectric layer formed on the lower electrode;
an upper electrode formed on the piezoelectric layer; and
a contact portion formed on the upper electrode.

4. The piezoelectric MEMS switch of claim 3, wherein the two outer cantilevers of the actuator are spaced apart by the length of the switching member.

5. The piezoelectric MEMS switch comprising:
a semiconductor substrate including a groove;
a support formed over the semiconductor substrate and the groove;
an actuator formed on the support and including a piezoelectric layer;
a switching member formed on the support on one side of the actuator, wherein upward movement of the switching member changes by a deformation of the piezoelectric layer of the actuator;
radio frequency (RF) transfer lines arranged at a predetermined distance on the switching member and separated by a predetermined interval from each other, wherein the actuator is formed to have at least two cantilevers each having one end such that the ends are connected to each other;
wherein the switching member comprises:
a contact connection portion formed on the support; and
contact portions formed on predetermined portions of the contact connection portion, wherein the upward movement of the contact connection portion is such that a first contact portion of the contact portions contacts one of the RF transfer lines and a second contact portion of the contact Portions contacts another of the RF transfer lines.

6. The piezoelectric MEMS switch of claim 5, wherein the contact connection portion is formed of the same material as the lower electrode of the actuator, and the contact portions are formed of the same material as the contact portion of the actuator.

7. The piezoelectric MEMS switch of claim 1, wherein the cap wafer comprises:
an electrode pad formed on the second surface; and
a via plug formed to pass through the cap wafer for electrically connecting the electrode pad and the RF transfer lines.

8. The piezoelectric MEMS switch of claim 1, further comprising a solder ball brought in contact with the electrode pad of the cap wafer.

9. The piezoelectric MEMS switch of claim 1, wherein the switching member has a length equal to or greater than a distance between the RF transfer lines.

10. A piezoelectric MEMS switch comprising:
a semiconductor substrate including a groove;
a support formed over the semiconductor substrate and the groove;
a switching member arranged on a predetermined portion of the support;
first and second actuators including a piezoelectric layer and symmetrically arranged on left and right sides of the switching member;
a cap wafer that is opposite to the semiconductor substrate at a predetermined distance; and
RF transfer lines separated by a predetermined interval from each other on a surface of the cap wafer corresponding to the switching member, wherein:
the first and second actuators each include at least two cantilevers having one end such that the ends are connected with each other, wherein the at least two cantilevers of each of the first and second actuators formed on left and right sides of the switching member are parallel and extend towards the switching member.

11. The piezoelectric MEMS switch of claim 10, further comprising:
a via plug formed in the cap wafer to be electrically connected to the RF transfer lines;
an electrode pad formed on an outer surface of the cap wafer to be brought in contact with the via plug; and
a solder ball to be brought in contact with the electrode pad.

* * * * *